US010424617B2

(12) United States Patent
Tsuji et al.

(10) Patent No.: US 10,424,617 B2
(45) Date of Patent: Sep. 24, 2019

(54) CROSSBAR SWITCH WITH AN ARRANGEMENT OF WIRES, LOGIC INTEGRATED CIRCUIT USING THE SAME, AND SEMICONDUCTOR DEVICE

(71) Applicant: NEC Corporation, Minato-ku, Tokyo (JP)

(72) Inventors: Yukihide Tsuji, Tokyo (JP); Xu Bai, Tokyo (JP); Makoto Miyamura, Tokyo (JP); Toshitsugu Sakamoto, Tokyo (JP); Munehiro Tada, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/508,980

(22) PCT Filed: Sep. 11, 2015

(86) PCT No.: PCT/JP2015/004645
§ 371 (c)(1),
(2) Date: Mar. 6, 2017

(87) PCT Pub. No.: WO2016/042750
PCT Pub. Date: Mar. 24, 2016

(65) Prior Publication Data
US 2017/0256587 A1 Sep. 7, 2017

(30) Foreign Application Priority Data

Sep. 18, 2014 (JP) .................. 2014-189843

(51) Int. Cl.
H01L 27/24 (2006.01)
H01L 21/82 (2006.01)
(Continued)

(52) U.S. Cl.
CPC .......... H01L 27/2463 (2013.01); H01L 21/82 (2013.01); H01L 23/528 (2013.01);
(Continued)

(58) Field of Classification Search
CPC ............... H01L 27/2463; H01L 23/528; H01L 27/2454; H01L 45/08; H01L 23/5226;
(Continued)

(56) References Cited

U.S. PATENT DOCUMENTS 4,871,930 A 10/1989 Wong et al.
8,830,738 B2 * 9/2014 Liu .................. H01L 27/2463
257/2
(Continued)

FOREIGN PATENT DOCUMENTS

JP 2005-101535 A 4/2005
WO 2011/158887 A1 12/2011
(Continued)

OTHER PUBLICATIONS

Guy Lemieux and David Lewis, "Using sparse crossbars within LUT Clusters", FPGA '01 Proceedings of the 2001 ACM/SIGDA ninth international symposium on Field programmable gate arrays, pp. 59-68, 2001. Monterey, California, USA.
(Continued)

Primary Examiner — Pho M Luu
Assistant Examiner — Jerome Leboeuf

(57) ABSTRACT

A crossbar switch includes a plurality of first wires extending in a first direction and second wires extending in a second direction. The switch includes third wires extending in a third direction and fourth wires extending in a fourth direction. The switch includes switch cells connected to the first and second wires. The first wires are skewed relative to the second and fourth wires, while the third wires are skewed relative to the second and fourth wires. The switch cells are connected to the third and fourth wires, and the third wires are also connected to the switch cells connected to the first wires adjacent to the respective first wires, or alternatively the fourth wires are also connected to the
(Continued)

switch cells connected to the second wires adjacent to the respective second wires.

10 Claims, 17 Drawing Sheets

(51) Int. Cl.
    *H01L 27/105*     (2006.01)
    *H01L 23/522*     (2006.01)
    *H01L 23/528*     (2006.01)
    *H01L 45/00*     (2006.01)
    *H03K 19/173*     (2006.01)
    *H03K 19/177*     (2006.01)

(52) U.S. Cl.
    CPC ........ *H01L 23/5226* (2013.01); *H01L 27/105* (2013.01); *H01L 27/2436* (2013.01); *H01L 27/2454* (2013.01); *H01L 45/08* (2013.01); *H03K 19/1735* (2013.01); *H03K 19/1776* (2013.01); *H03K 19/17728* (2013.01)

(58) Field of Classification Search
    CPC ......... H03K 19/1776; H03K 19/17728; H03K 19/1735
    See application file for complete search history.

(56) References Cited

U.S. PATENT DOCUMENTS

| | | |
|---|---|---|
| 2005/0045919 A1 | 3/2005 | Kaeriyama et al. |
| 2009/0122598 A1* | 5/2009 | Toda ............... G11C 5/063 365/158 |
| 2013/0181180 A1* | 7/2013 | Tada ............... G11C 13/0007 257/1 |

FOREIGN PATENT DOCUMENTS

| | | |
|---|---|---|
| WO | 2012/043502 A1 | 4/2012 |
| WO | 2013/190742 A1 | 12/2013 |

OTHER PUBLICATIONS

International Search Report for PCT Application No. PCT/JP2015/004645, dated Nov. 2, 2015.

English translation of Written opinion for PCT Application No. PCT/JP2015/004645.

\* cited by examiner

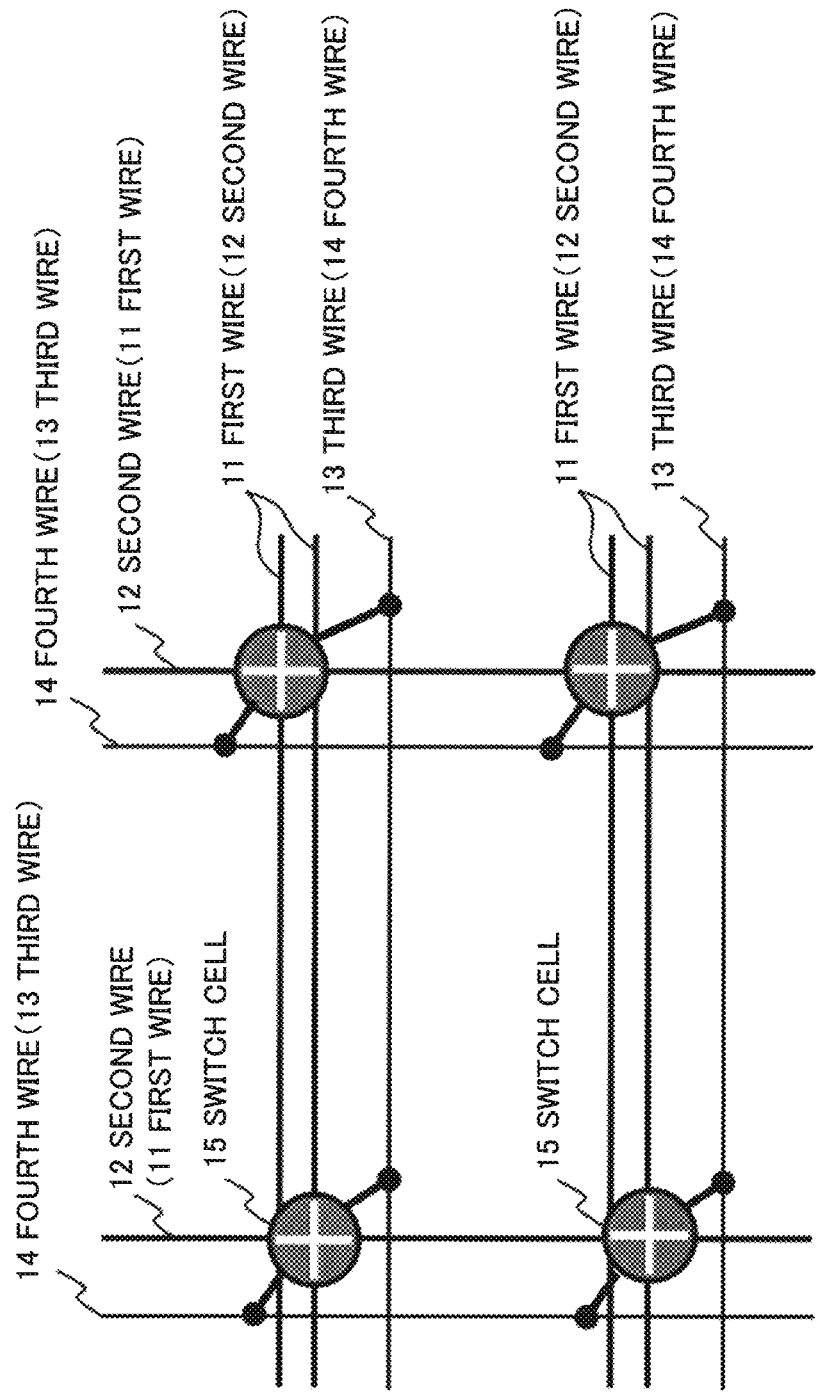

Fig. 2C

| RESISTANCE STATE | APPLIED VOLTAGE | |
|---|---|---|
| | TR[1] | TR[2] |
| HIGH RESISTANCE → LOW RESISTANCE | HIGH | LOW |
| LOW RESISTANCE → HIGH RESISTANCE | LOW | HIGH |

Fig. 6

| SWITCH [n,k] : SELECTED SWITCH | | | | |
|---|---|---|---|---|
| RESISTANCE STATE BETWEEN TR1 AND TR2 | APPLIED VOLTAGE | | | |
| | RV[n] | RH[k] | SV[n] | GH[k] |
| HIGH RESISTANCE → LOW RESISTANCE | HIGH | HIGH | LOW | HIGH |
| LOW RESISTANCE → HIGH RESISTANCE | LOW | LOW | HIGH | HIGH |

Fig. 11

| RESISTANCE STATE BETWEEN TR1 AND TR2 | SWITCH [n,k] :SELECTED SWITCH | | | |
|---|---|---|---|---|
| | APPLIED VOLTAGE | | | |
| | RV[n] | RH[k] | SV[n] | GH[k] |
| HIGH RESISTANCE → LOW RESISTANCE | HIGH | HIGH | LOW | HIGH |
| LOW RESISTANCE → HIGH RESISTANCE | LOW | LOW | HIGH | HIGH |

CROSSBAR SWITCH WITH AN ARRANGEMENT OF WIRES, LOGIC INTEGRATED CIRCUIT USING THE SAME, AND SEMICONDUCTOR DEVICE

This application is a National Stage Entry of PCT/JP2015/004645 filed on Sep. 11, 2015, which claims priority from Japanese Patent Application 2014-189843 filed on Sep. 18, 2014, the contents of all of which are incorporated herein by reference, in their entirety.

TECHNICAL FIELD

The present invention relates to a programmable logic integrated circuit using a resistive switching element.

BACKGROUND ART

A programmable logic integrated circuit has a feature in that various logic circuits can be reconfigured by rewriting internal set information. Thus, the programmable logic integrated circuit is used in a wide range of fields, such as creation of a prototype, image processing, and communication. In addition, in PTL 1 and PTL 2, a technique that can reduce the chip area and the power consumption by substituting a memory cell and a switching part of a crossbar switch used in a programmable logic integrated circuit with a resistive switching element is proposed.

Examples of the resistive switching element include ReRAM (Resistance Random Access Memory) using a transition metal oxide and NanoBridge (registered trademark) using an ion conductor. In PTL 1 and PTL 2, a resistive switching element using movement of metal ions and an electrochemical reaction in a solid (ion conductor) where ions can freely move by application of an electric field or the like is disclosed.

FIG. 2A, FIG. 2B, and FIG. 2C respectively illustrate a structure of a resistive switching element (RE), a symbolic expression of the resistive switching element (RE), and an operation method for changing the resistance of the resistive switching element (RE). As illustrated in FIG. 2A, the resistive switching element (RE) is composed of an ion-conducting layer (IC), and a first electrode (TR[1]) and a second electrode (TR[2]) that are provided on the opposite surfaces in contact with the ion-conducting layer (IC). Metal ions are supplied from the first electrode (TR[1]) to the ion-conducting layer (IC), and metal ions are not supplied from the second electrode (TR[2]). As illustrated in FIG. 2C, the resistance value of the ion conductor is changed by changing the applied voltage polarity, and ON/OFF is switched by controlling the conduction state between the two electrodes.

As illustrated in PTL 2 and FIG. 3A, a switch cell is composed of two resistive switching elements (RE1, RE2) and one transistor (Tr.). FIG. 3B is a symbolic expression of FIG. 3A focusing on terminals. As illustrated in FIG. 4A, in a crossbar switch, the switch cell is arranged in the vicinity of each of cross-points between wires (RV) in the vertical direction and wires (RH) in the horizontal direction. In addition, when turning ON/OFF a resistive switching element in the vicinity of a certain cross-point, in order to prevent erroneous writing (disturb) into a resistive switching element present in the vicinity of a different cross-point, the switch cell is also connected to two wires (SV, GH) for controlling a selection transistor (Tr.).

As illustrated in FIG. 4B, the crossbar switch takes the form in which at least four types of wires (RV, RH, SV, GH) pass in the vertical or horizontal direction. From the viewpoint of writing selectivity of the cell, the wire SV and the wire GH for switching, and the wire RV and the wire RH need to be skew each other, and, for example, are perpendicular as in FIG. 4B. The transistor in the switch cell is formed on a silicon substrate, and the resistive switching elements are formed in wiring layers.

The resistive switching elements can be the minimum size in the design rule or less. In addition, since ON/OFF switching at low voltage and low current has become possible by improvement in the element performance, the gate width of the selection transistor can be made small. Thus, the size of the entire crossbar switch has been defined by the four wires for the connection to the switch cell, and the occupation area necessary for the connection between the elements and the wires rather than the occupation area of the switch cell.

As illustrated in PTL 2 or PTL 3, the crossbar switch is used in a signal selection block (IMUX) of an input pre-stage into a look-up table (LUT) of a programmable logic integrated circuit, and a switching block (SMUX) for changing a routing path of a signal among a plurality of LUTs arranged in a programmable logic circuit.

CITATION LIST

Patent Literature

[PTL 1] JP 2005-101535 A
[PTL 2] WO 2012/043502
[PTL 3] U.S. Pat. No. 4,871,930

Non Patent Literature

[NPL 1] Guy Lemieux and David Lewis, "Using sparse crossbars within LUT", FPGA '01 Proceedings of the 2001 ACM/SIGDA ninth international symposium on Field programmable gate arrays, Pages 59-68, 2001.

SUMMARY OF INVENTION

Technical Problem

In a relevant crossbar switch using a resistive switching element, which is illustrated in FIG. 5, when performing ON/OFF switching of a certain switch cell, each of signals of four types of wires needs to be controlled, as illustrated in FIG. 6. Thus, there is a problem in that a decode circuit for performing designation of a rewrite cell and control of a wire connected to the rewrite cell, which is arranged at the periphery of the crossbar switch, becomes complex, thereby increasing the circuit area.

In addition, when rearranging remaining switch cells in an empty space obtained by thinning out switch cells as in FIG. 7 to reduce the circuit area, wires connected to the switch cells need to be rearranged at the same time. Accordingly, as illustrated in FIG. 8, for example, the signal line density increases by up to 100% compared to before the rearrangement. However, there is a problem in that the area reduction ratio of the actual layout is smaller compared to the thinning-out ratio of the crossbar switch due to limitations of the wires, and a connecting space between the wires and between the elements and the wires.

The present invention was made in view of the above-described problems, and an object thereof is to provide a crossbar switch that reduces the layout areas of the crossbar switch and peripheral circuits thereof.

Solution to Problem

A crossbar switch according to the present invention includes a plurality of first wires extending in a first direction, a plurality of second wires extending in a second direction, a plurality of third wires extending in a third direction, a plurality of fourth wires extending in a fourth direction, and a plurality of switch cells connected to the first wires and the second wires, in which the first wires are skew relative to the second wires and the fourth wires, the third wires are skew relative to the second wires and the fourth wires, the switch cells are connected to the third wires and the fourth wires, and furthermore, the third wires are also connected to the switch cells connected to the first wires adjacent to the respective first wires, or furthermore, the fourth wires are also connected to the switch cells connected to the second wires adjacent to the respective second wires.

A logic integrated circuit according to the present invention includes the crossbar switch which includes a plurality of first wires extending in a first direction, a plurality of second wires extending in a second direction, a plurality of third wires extending in a third direction, a plurality of fourth wires extending in a fourth direction, and a plurality of switch cells connected to the first wires and the second wires, in which the first wires are skew relative to the second wires and the fourth wires, the third wires are skew relative to the second wires and the fourth wires, the switch cells are connected to the third wires and the fourth wires, and furthermore, the third wires are also connected to the switch cells connected to the first wires adjacent to the respective first wires, or furthermore, the fourth wires are also connected to the switch cells connected to the second wires adjacent to the respective second wires.

A semiconductor device according to the present invention includes the logic integrated circuit which includes the crossbar switch which includes a plurality of first wires extending in a first direction, a plurality of second wires extending in a second direction, a plurality of third wires extending in a third direction, a plurality of fourth wires extending in a fourth direction, and a plurality of switch cells connected to the first wires and the second wires, in which the first wires are skew relative to the second wires and the fourth wires, the third wires are skew relative to the second wires and the fourth wires, the switch cells are connected to the third wires and the fourth wires, and furthermore, the third wires are also connected to the switch cells connected to the first wires adjacent to the respective first wires, or furthermore, the fourth wires are also connected to the switch cells connected to the second wires adjacent to the respective second wires.

Advantageous Effects of Invention

According to the present invention, a crossbar switch that reduces the layout areas of the crossbar switch and peripheral circuits thereof can be provided.

BRIEF DESCRIPTION OF DRAWINGS

FIG. 1 is a diagram illustrating a configuration of a crossbar switch of an example embodiment of the present invention.

FIG. 2C is a diagram illustrating an operation method for changing the resistance of the resistive switching element.

FIG. 6 is a diagram illustrating a state of a control signal during ON/OFF switching with respect to a switch[n, k].

FIG. 11 is a diagram illustrating a state of a control signal during ON/OFF switching with respect to the switch[n, k] of the crossbar switch of the example embodiment of the present invention.

DESCRIPTION OF EMBODIMENTS

Figure 2A:
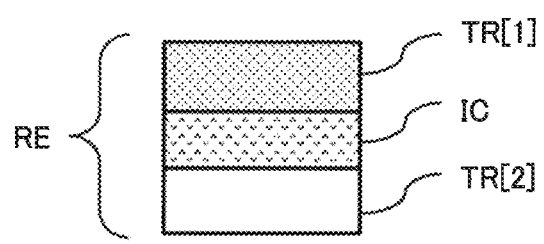
FIG. 2A is a diagram illustrating a structure of a resistive switching element.

Hereinafter, an example embodiment of the present invention will be described in detail with reference to the drawings. While the example embodiment described below includes technically preferable limitations to carry out the present invention, the scope of the invention is not limited to the following.

FIG. 1 is a diagram illustrating a configuration of a crossbar switch of the example embodiment of the present invention. The crossbar switch of the present example embodiment includes a plurality of first wires 11 extending in a first direction, a plurality of second wires 12 extending in a second direction, a plurality of third wires 13 extending in a third direction, and a plurality of fourth wires 14 extending in a fourth direction. Furthermore, the crossbar switch includes a plurality of switch cells 15 connected to the first wires 11 and the second wires 12. In addition, the first wires are skew relative to the second wires and the fourth wires, and the third wires are skew relative to the second wires and the fourth wires. In addition, the switch cells 15 are connected to the third wires 13 and the fourth wires 14. Furthermore, the third wires 13 are also connected to the switch cells 15 connected to the first wires 11 adjacent to the respective first wires 11, or furthermore, the fourth wires 14 are also connected to the switch cells 15 connected to the second wires 12 adjacent to the respective second wires 12.

Hereinafter, the crossbar switch of the present example embodiment will be described in further detail.

Figure 2B:
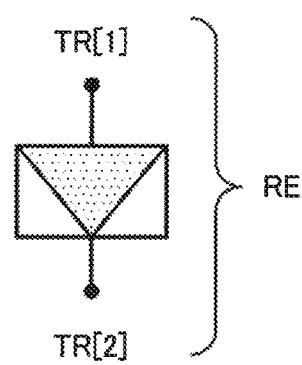
FIG. 2B is a diagram symbolically expressing the resistive switching element.
Figure 3A:
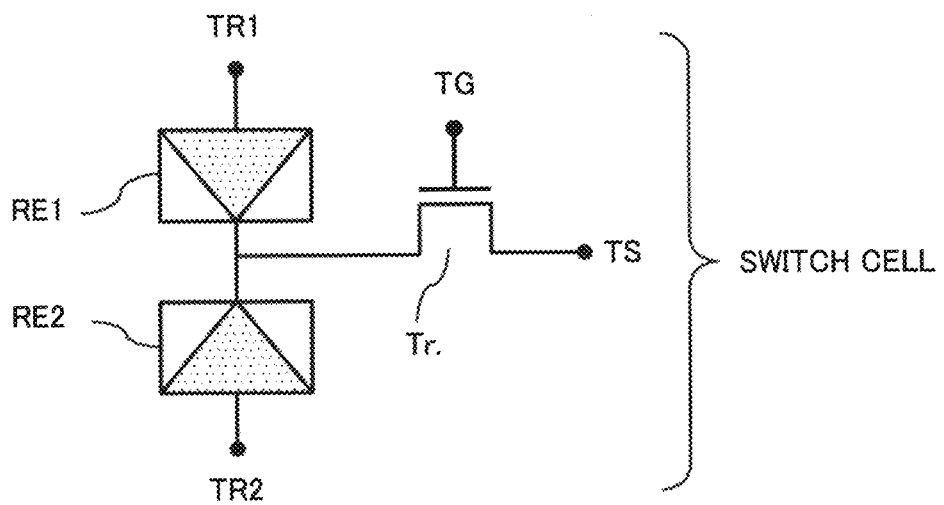
FIG. 3A is a diagram illustrating a structure of a switch cell composed of two resistive switching elements and a transistor.
Figure 3B:
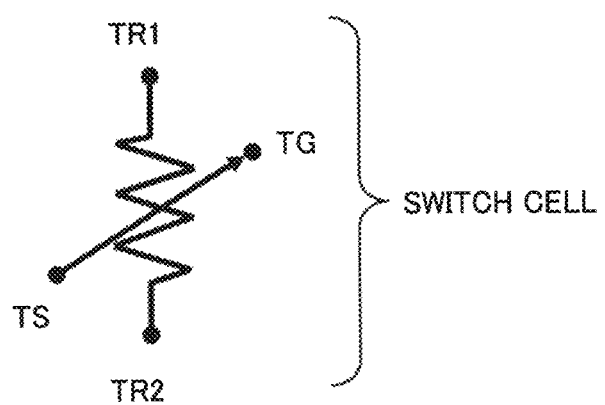
FIG. 3B is a diagram symbolically expressing the switch cell composed of two resistive switching elements and a transistor.

As illustrated in FIG. 3A, the switch cell of the crossbar switch of the present example embodiment includes two resistive switching elements (RE) illustrated in FIG. 2B, (RE1, RE2), and a switch element (Tr.). Electrodes on one side of the two resistive switching elements (RE1, RE2) are connected to each other, and, to a node shared by the connection, one diffusion layer (source or drain) of the selection transistor (Tr.) is connected. FIG. 3B is a symbolic expression focusing on terminals of the switch cell illustrated in FIG. 3A.

Figure 4A:
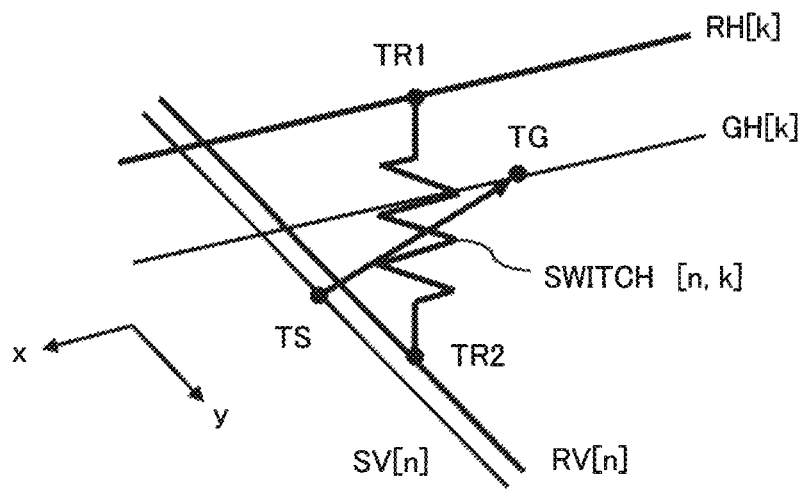
FIG. 4A is a diagram illustrating the connection of the switch cell with signal lines/control lines (perspective view).
Figure 4B:
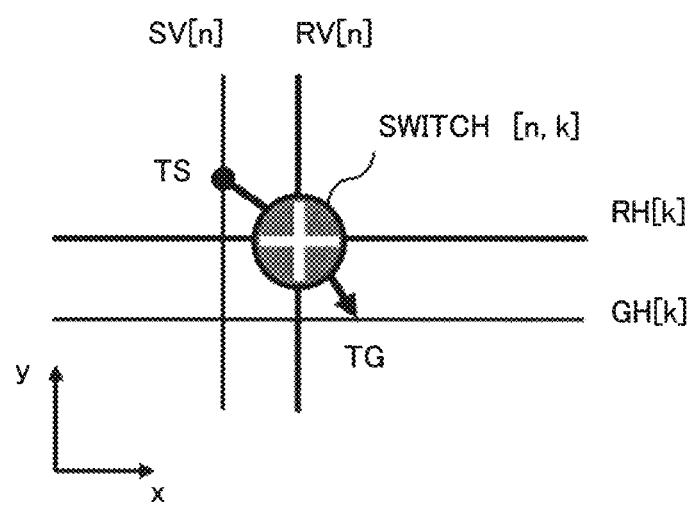
FIG. 4B is a diagram illustrating the connection of the switch cell with the signal lines/control lines (top view).
Figure 5:
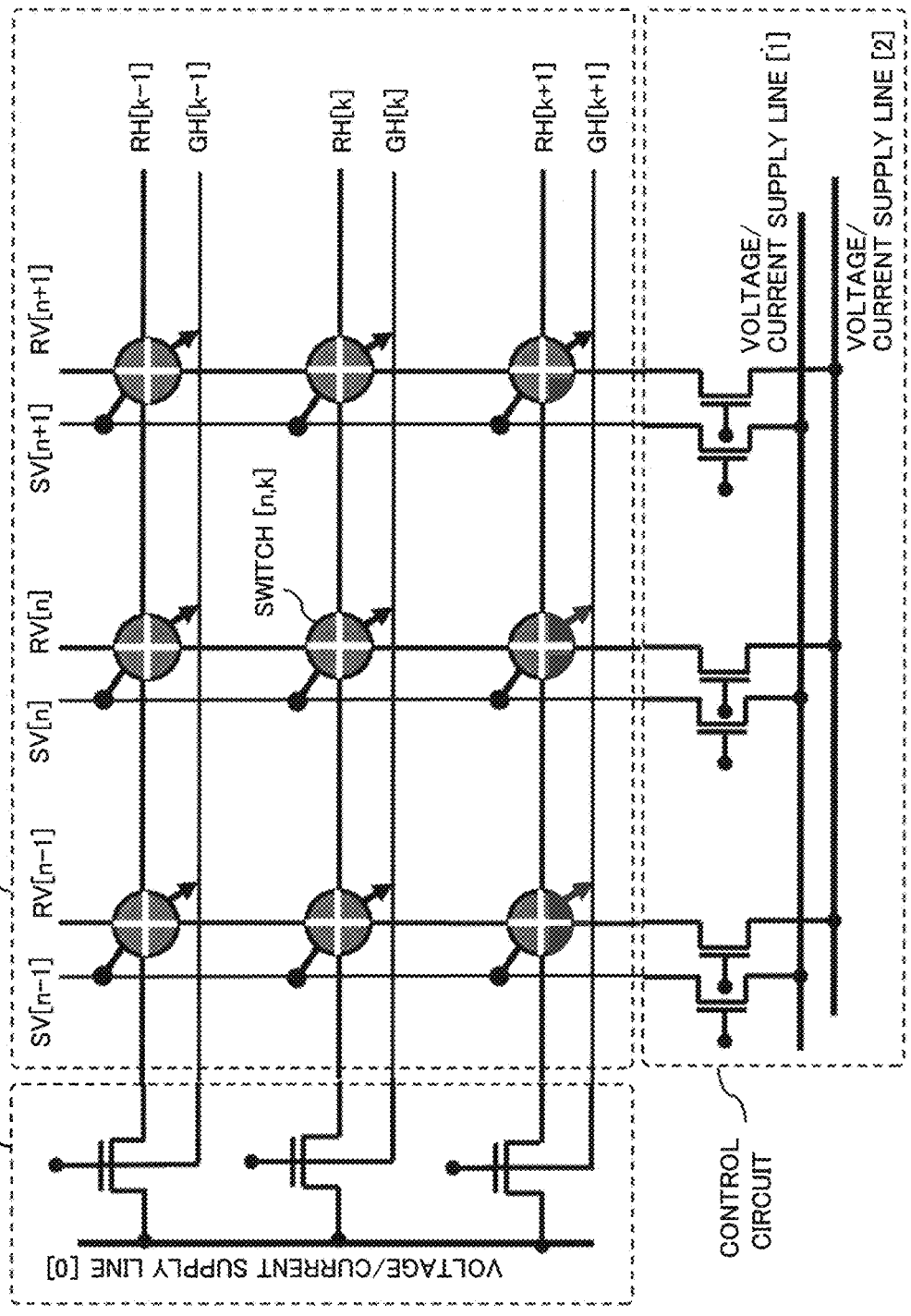
FIG. 5 is a diagram illustrating a configuration including an ON/OFF switching control circuit of a switch cell in a relevant crossbar switching circuit using the switch cell.
Figure 7:
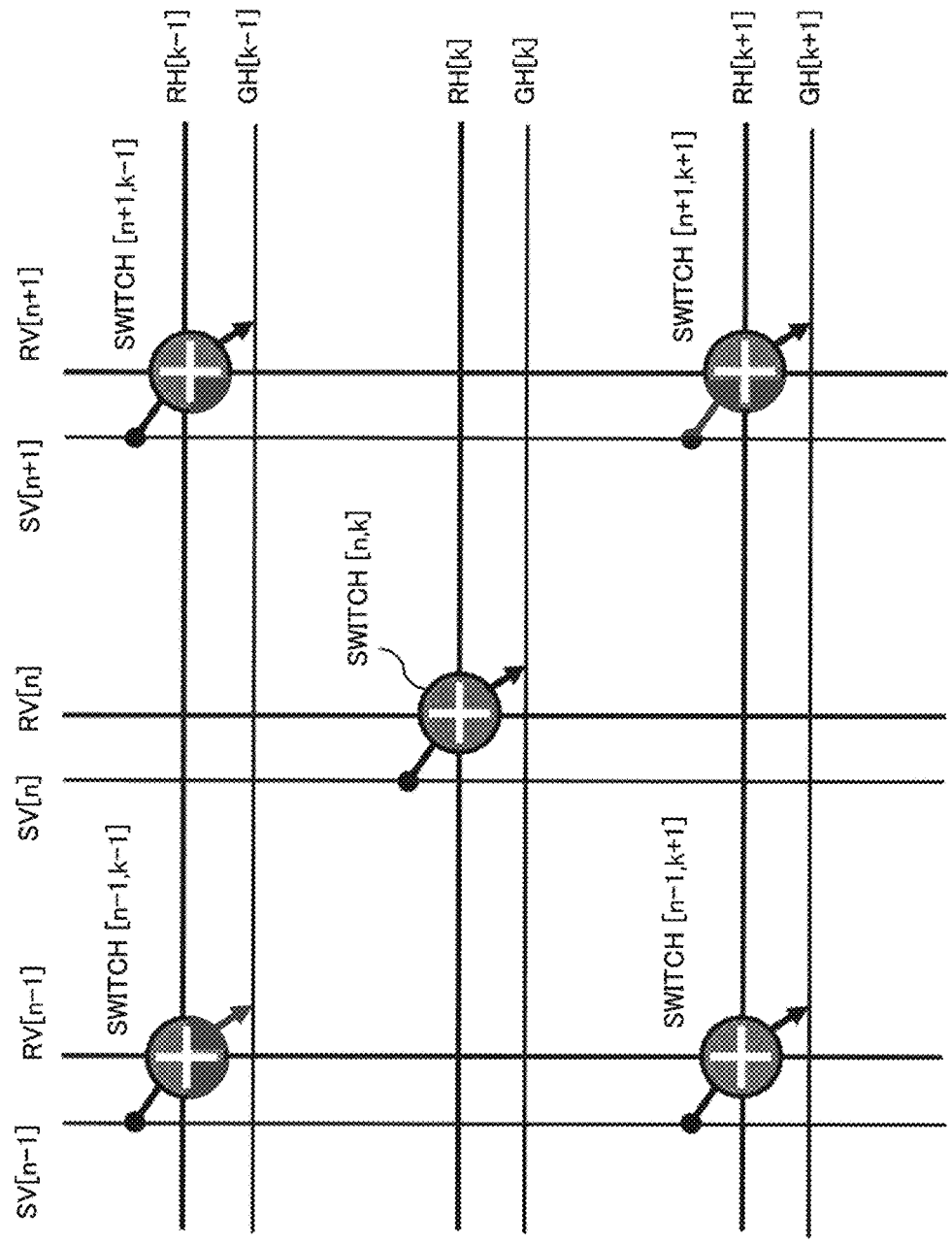
FIG. 7 is a diagram illustrating the relevant crossbar switch in which the number of switch cells is smaller than the number of cross-points.
Figure 8:
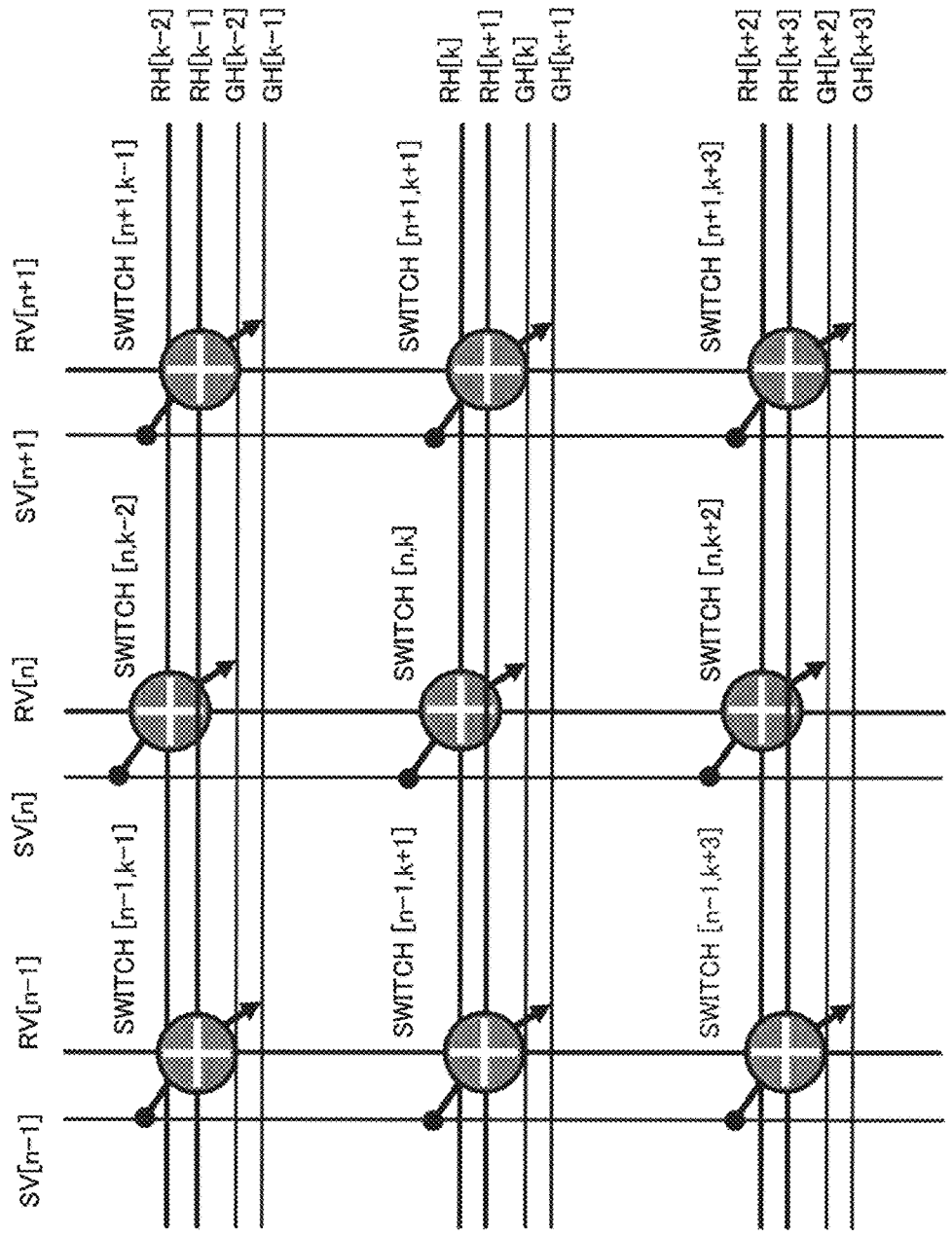
FIG. 8 is a diagram illustrating a crossbar switch when switch cells are densely arranged by shifting switch cells for the relevant crossbar switch in which the number of switch cells is smaller than the number of cross-points.

As illustrated in FIG. 4A and FIG. 4B, the above-described switch cell is arranged in the vicinity of a cross-point between a signal wire (RV) in the vertical direction and a signal wire (RH) in the horizontal direction of the crossbar switch. Electrodes TR1 and TR2 of the two resistive switching elements (RE1, RE2) on the side which is not shared between the resistive switching elements are connected to the wire (RH) and the wire (RV), respectively. Furthermore, in addition to the above-described wires, a wire (GH) connected to a gate of the selection transistor, and a wire (SV) connected to a diffusion layer (drain or source) on the side to which the resistive switching elements are not connected are provided. They pass in the crossbar switch separately from the wire (RH) and the wire (RV), and are shared among switch cells in the passing directions.

Figure 9:
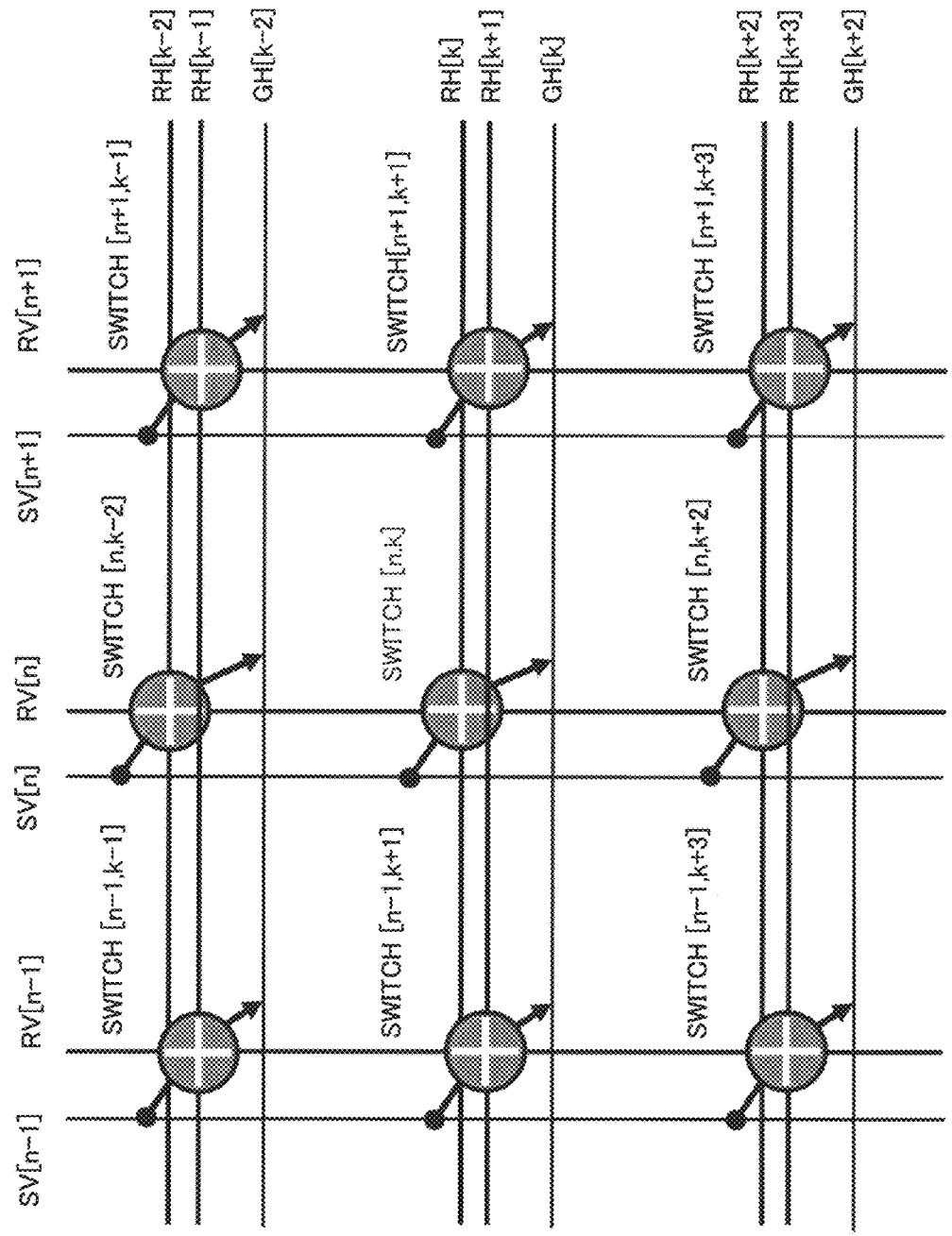
FIG. 9 is a diagram illustrating a configuration of the crossbar switch of the example embodiment of the present invention.

FIG. 9 is a diagram illustrating a configuration of the crossbar switch of the present example embodiment. In the crossbar switch, switch cells are thinned out and arranged at cross-points between the wires (RV, RH) in the vertical direction and the horizontal direction, and switch cells are not arranged at all cross-points. However, as illustrated in FIG. 9, the switch cells are preferably provided periodically corresponding to the cross-points between the wires (RV, RH), but are not limited thereto.

In this crossbar switch, for example, a wire (GH[k]) among wires (GH) to selection transistors, which pass in the horizontal direction, is connected to a switch cell (switch[n, k]) connected to a wire (RH[k]) which passes in the horizontal direction in the same way. Here, each of n and k is a positive integer. Furthermore, the wire (GH[k]) is also connected to switch cells (switch[n−1, k+1], switch[n+1, k+1]) connected to a wire (RH[k+1]) which passes in the horizontal direction in the same way adjacent to the wire (RH[k]). More specifically, the wire (GH[k]) is shared by the switch cells connected to the wire (RH[k]) and the wire (RH[k+1]).

Figure 10:
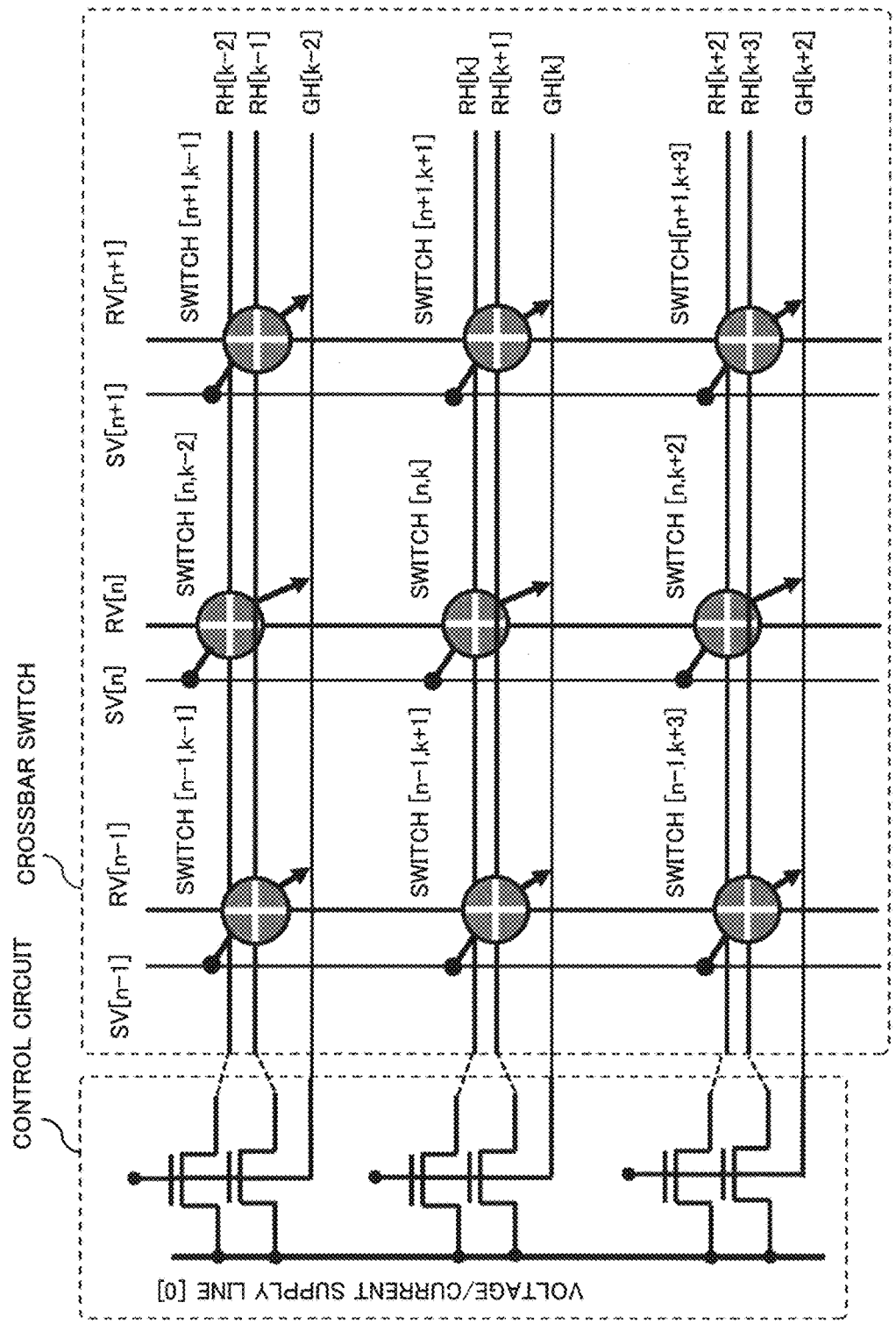
FIG. 10 is a diagram illustrating a configuration of the crossbar switch of the example embodiment of the present invention including an ON/OFF rewriting control circuit of switches.

Since the number of wires is reduced by sharing the signal wires (GH) for switching, a writing control circuit illustrated in FIG. 10 and a selection circuit (decode circuit, not illustrated in the drawing) corresponding thereto can also be simplified.

As described above, the number of the passing wires (GH) for the selection transistors can be reduced, and it becomes easy to rearrange switch cells with the above-described wires (GH) in an empty space of thinned-out switch cells. Therefore, the area reduction effect of the crossbar switch is obtained more easily by the thinned-out switch cells. In addition, the writing control circuit that controls the above-described wires and the decode circuit corresponding thereto can also be simplified with the reduction of the wires (GH) for the selection transistors, which pass in the horizontal direction, and thus, peripheral circuits for the crossbar switch, which perform ON/OFF switching and the like, can also be made small.

It is to be noted that RH and RV, and GH and SV have only to be skew, respectively, and do not necessarily have to be perpendicular to each other. In addition, although the writing wires (GH) are shared in FIG. 9, the writing wires (SV) may be shared from the viewpoint of the symmetric property, and the shift direction may be a perpendicular direction with respect to the wires SV. In addition, the ratio (N(sw)/N(cp)) of the total number N(sw) of the switch cells to the total number N(cp) of the cross-points of the wires is not limited to 50%, and has only to be smaller than 100%. It is to be noted that (N(sw)/N(cp)) does not have to be the same in the entire region of the crossbar switch. However, it is more preferable that the distance (pitch) between the switch cells is uniform in the crossbar switch circuit. More specifically, it is preferable that the switch cells are arranged periodically.

FIG. 11 illustrates a state of a control signal during ON/OFF switching with respect to the switch[n, k] of the crossbar switch of the present example embodiment. As illustrated in FIG. 11, the resistance state can be changed between high resistance and low resistance by individually controlling signals of the four types of wires, and switching operation is possible.

More specifically, the applied voltage of the wire (GH[k]) is made high, the gate line connected thereto is activated to set the transistor to be in an on state, and the switch cell (switch[n, k]) is selected. A potential difference is applied to between the wires (RH[k] and RV[n]) connected to the resistive switching elements and the wire SV[n], and the polarity (high-low or low-high) is changed to program the resistance state to be high resistance or low resistance.

Examples of the resistive switching element used in the switch cell can include ReRAM (Resistance Random Access Memory) using a transition metal oxide and NanoBridge (registered trademark) using an ion conductor. More specifically, the resistive switching element has only to be a resistive switching element in which the resistance state is changed by application of a certain voltage or higher for predetermined time or more, and maintained. In addition, in view of high disturbance resistance when being used while making signals pass continuously, the resistive switching element is a bipolar-type resistive switching element in which an application direction of voltage for changing the resistance has a polarity. It is more preferable that the switch cell have a configuration in which two bipolar-type resistive switching elements are opposed to each other and connected in series, and a switch (transistor) is arranged at the connecting point of the two switches.

The resistive switching element (RE) is a resistive switching element using movement of metal ions and an electrochemical reaction in a solid (ion conductor) where ions can freely move by application of an electric field or the like. The resistive switching element has a large amount of resistive changing, and functions as a switch element that can distinguish between passing and not passing of signals between electrodes. As illustrated in FIG. 2A, the resistive switching element (RE) is composed of an ion-conducting layer (IC), and an electrode (TR[1]) and an electrode (TR[2]) that are provided on the opposite surfaces in contact with the ion-conducting layer (IC). Metal ions are supplied from the electrode (TR[1]) to the ion-conducting layer, and metal ions are not supplied from the electrode (TR[2]). The resistance value of the ion conductor is changed by changing the applied voltage polarity, so that the conduction state between the two electrodes can be controlled.

Figure 12:
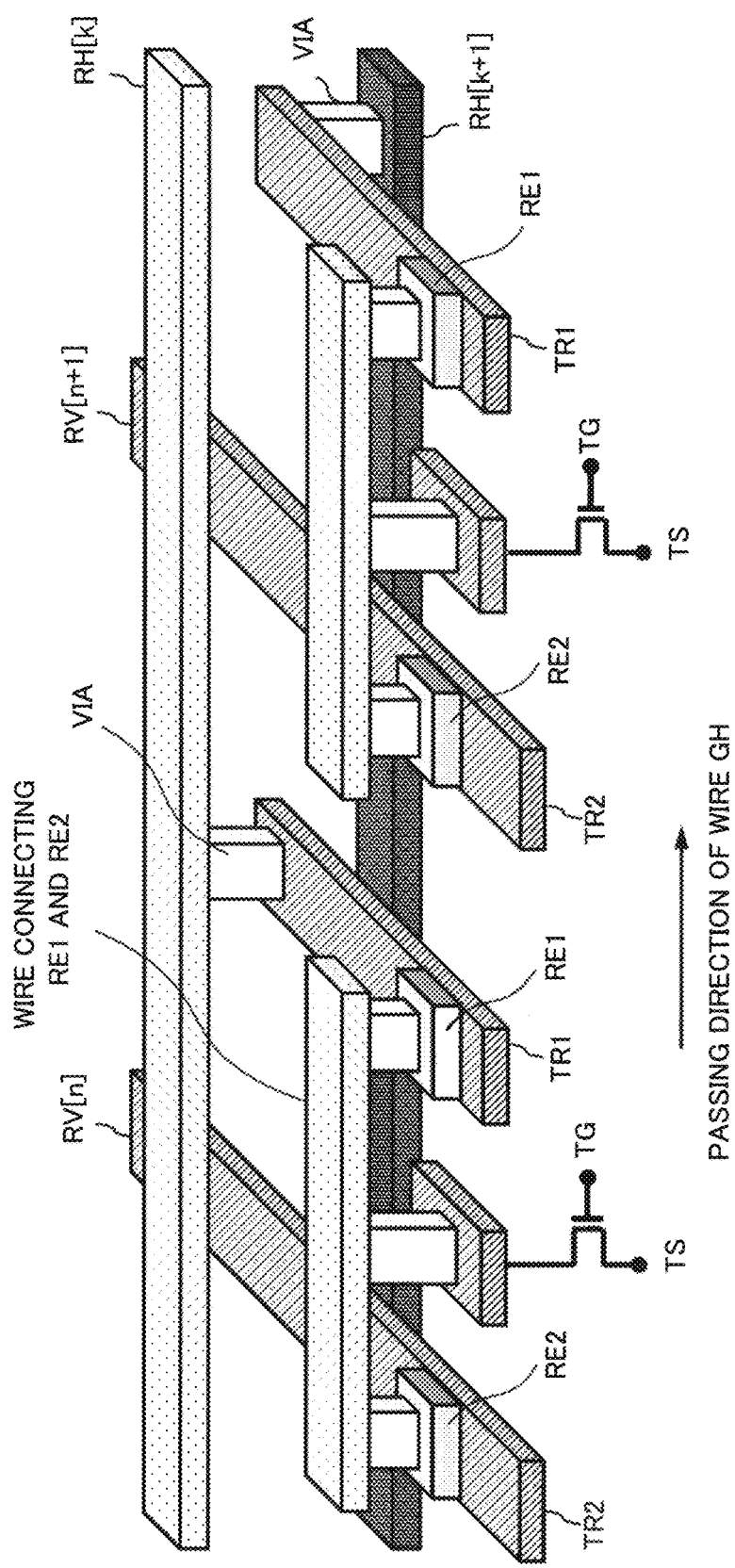
FIG. 12 is a diagram illustrating a wiring layout of the crossbar switch of the example embodiment of the present invention.
Figure 13A:
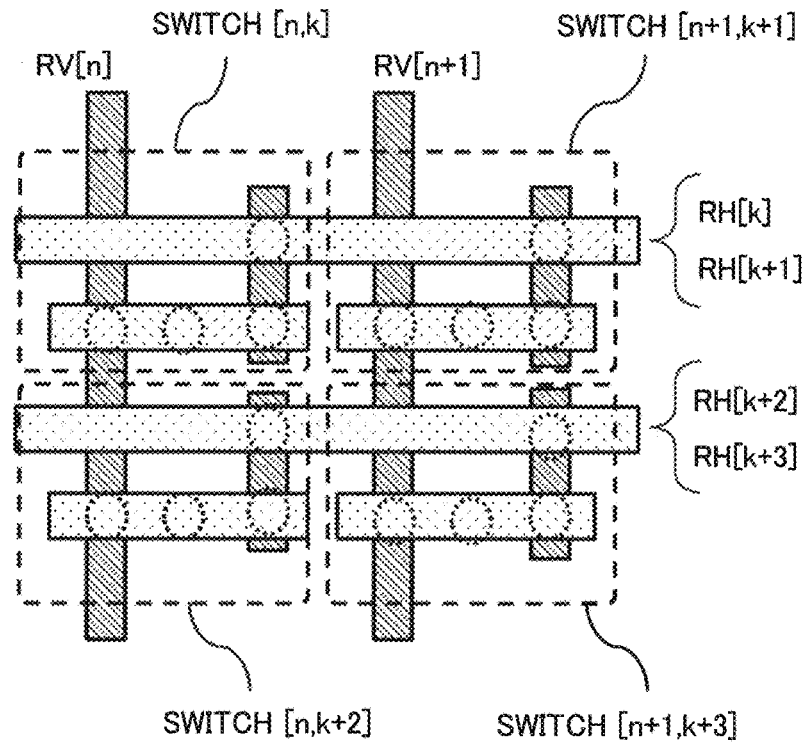
FIG. 13A is a diagram illustrating the wiring layout in an in-plane direction when the crossbar switch of the example embodiment of the present invention is viewed from above with respect to a silicon substrate.
Figure 13B:
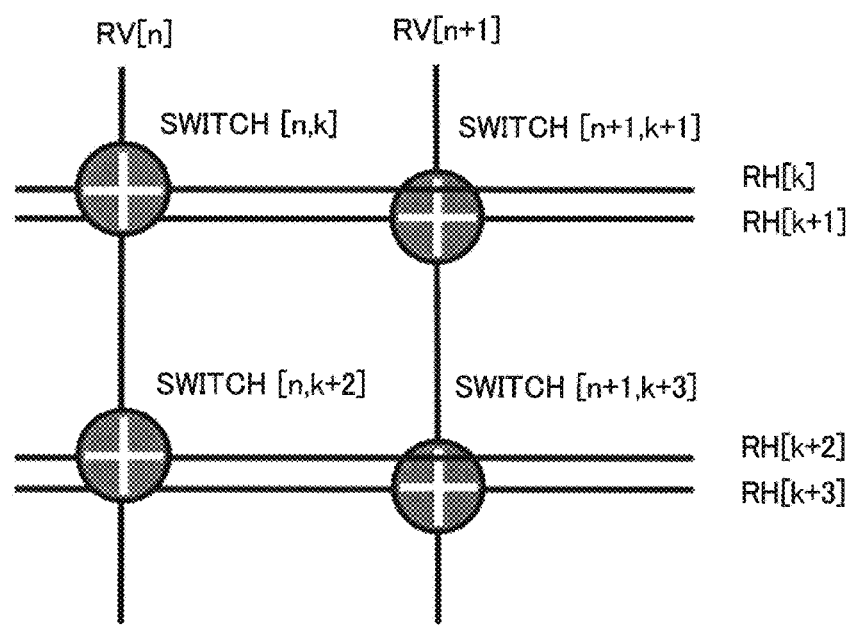
FIG. 13B is a diagram symbolically expressing the wiring layout of the crossbar switch of the example embodiment of the present invention (writing signal lines are omitted).

FIG. 12 is a diagram illustrating a wiring layout of the crossbar switch of the present example embodiment. FIG. 13A is a diagram illustrating the wiring layout in an in-plane direction when the crossbar switch of the present example embodiment is viewed from above with respect to a silicon substrate. FIG. 13B is a diagram symbolically expressing the wiring layout of the crossbar switch of the present example embodiment. In the respective drawings, the writing signal wires (GH, SV) are omitted.

As illustrated in FIG. 12, the resistive switching element RE2 and the wire RV are arranged to overlap when viewed from above the substrate. Thus, when distinguishing between connection and non-connection of the wire RV to the resistive switching element RE2 of a different switch cell, a via needs to be prepared separately, and an extra wiring space for the via becomes necessary. On the other hand, the wire RH is connected to the resistive switching element RE1 through a via. Thus, distinction between connection and non-connection of the wire RH to the resistive switching element RE1 of a different switch cell can be determined by the presence or absence of a via for which a space is already allowed.

In the crossbar switch of FIG. 9, the passing direction of the wires GH and a direction of a wire that connects the two resistive switching elements (RE1, RE2) in the switch cell are made to be the same, and a direction of shift arrangement of the switch cell is made to be skew relative to the passing direction of the wires GH. More specifically, the skew direction is a perpendicular direction in FIGS. 12, 13A, and 13B.

Accordingly, the wires RV do not need to be moved, and the wire density of the wires RV does not need to be changed. On the other hand, regarding the wires RH, by making the wire RH[k] and the wire RH[k+1] overlap using upper and lower wiring layers, the wire density can be doubled easily, and moreover, distinction between connection and non-connection of the wire RH to the switch cell can be determined by the presence or absence of a via for which a space is already allowed. Thus, a switch cell in which the density of the wires RH is doubled can be easily rearranged in the crossbar switch.

For example, a logic element including four look-up tables with four inputs and one output is assumed as a reconfiguration circuit. It is assumed that the logic element includes a switch block for operating the look-up tables as one cluster by connecting the look-up tables, and a switch block for switching a signal path among a plurality of logic elements. In this case, for example, it is assumed that 50% of switch cells of a crossbar switch for switching wires including four lanes of signal lines having a length of eight segments (separated by a distance equivalent to eight logic elements) are thinned out. Even in this state, twenty types, in total, of logic operations of a general example (MCNC (Microelectronics Center of North Carolina) benchmark) can be realized. More specifically, the area of the crossbar switch that is a switch block can be reduced by 50% while maintaining the performance of the reconfiguration circuit equivalent to that before thinning out the switch cells.

Figure 14:
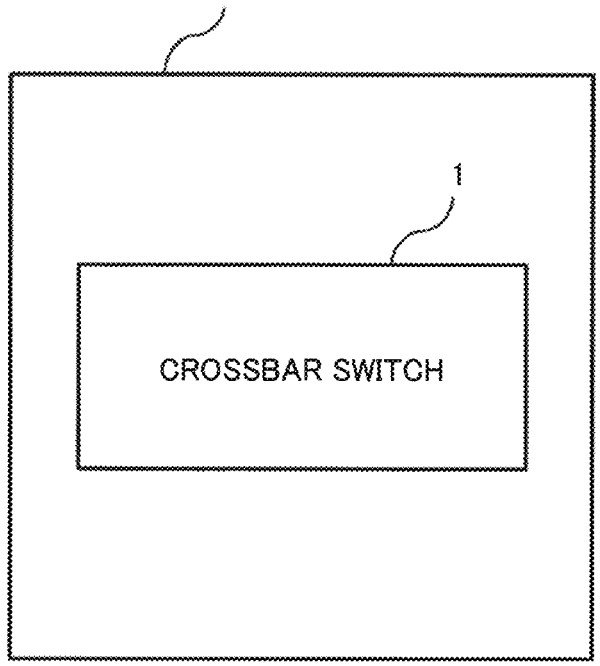
FIG. 14 is a diagram illustrating a logic integrated circuit using the crossbar switch of the example embodiment of the present invention.
Figure 15:
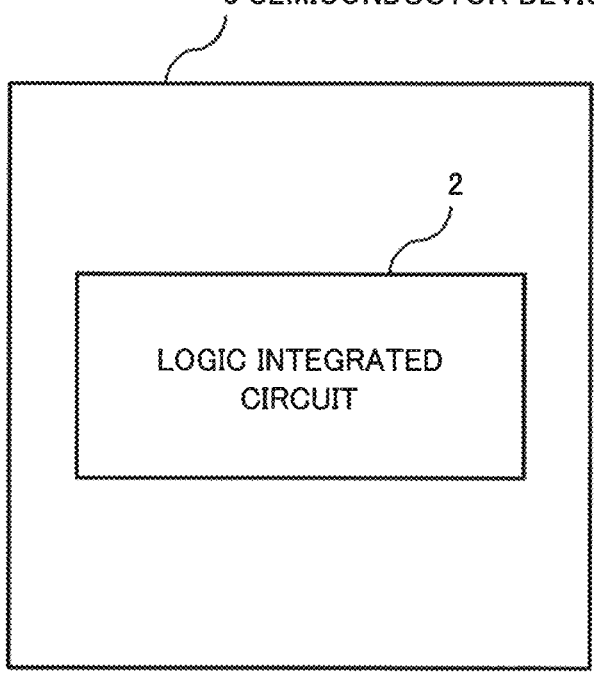
FIG. 15 is a diagram illustrating a semiconductor device using the logic integrated circuit using the crossbar switch of the example embodiment of the present invention.

FIG. 14 illustrates a logic integrated circuit 2 including a crossbar switch 1 of the present example embodiment. The logic integrated circuit 2 can reconfigure a logic circuit by switching operation of the crossbar switch 1. FIG. 15 is a semiconductor device 3 including the logic integrated circuit 2 including the crossbar switch 1 of the present example embodiment. In the semiconductor device 3, the logic integrated circuit 2 including the crossbar switch 1 is formed on a silicon substrate. Furthermore, these elements and circuits may be packaged for protection.

Figure 16:
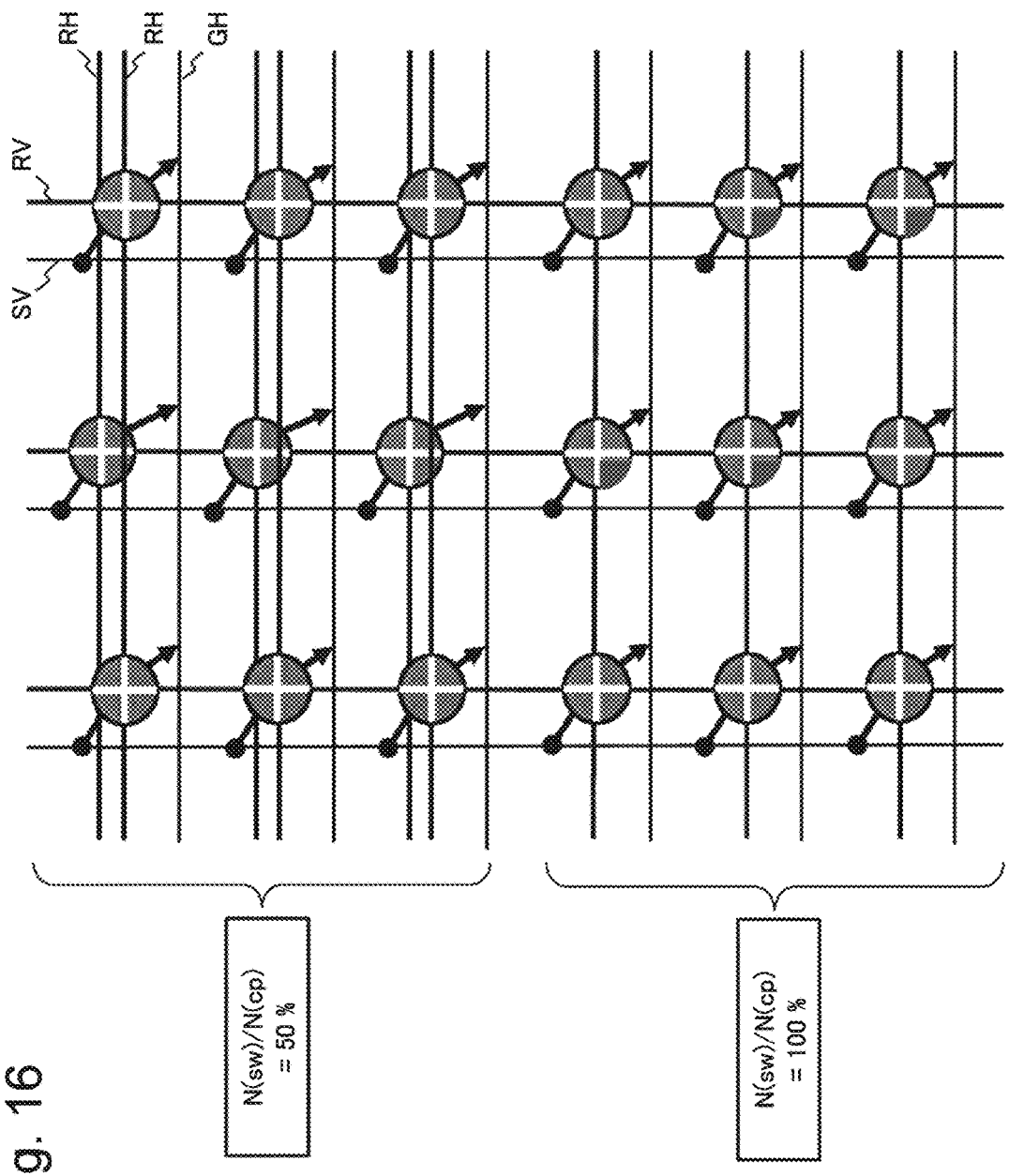
FIG. 16 is a diagram illustrating a configuration using the crossbar switch of the example embodiment of the present invention, in which crossbar switches whose ratios of the total number of the switch cells to the total number of the cross-points of the signal lines are different are arranged to be mixed.
Figure 17:
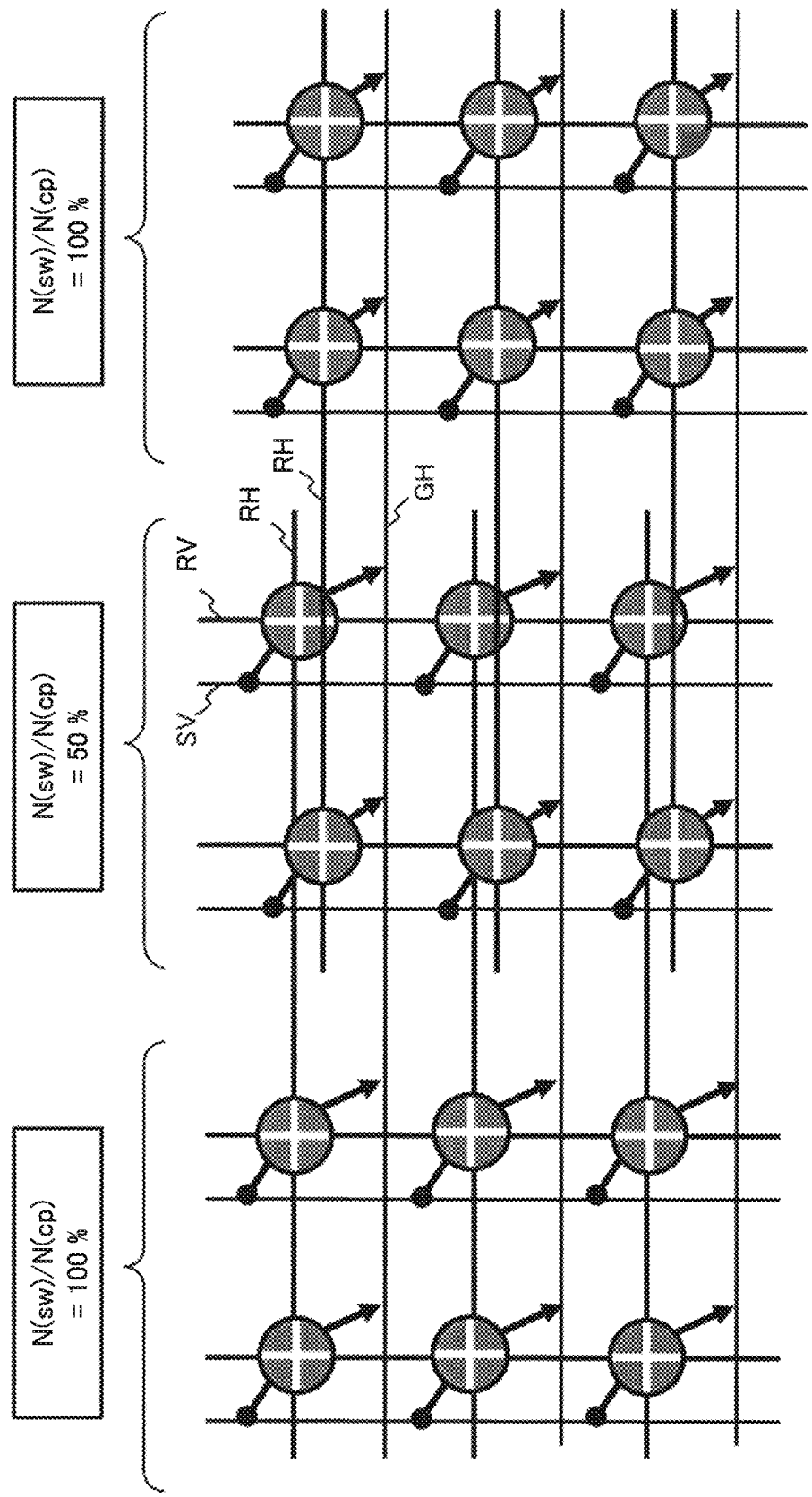
FIG. 17 is a diagram illustrating a configuration using the crossbar switch of the example embodiment of the present invention, in which crossbar switches whose ratios of the total number of the switch cells to the total number of the cross-points of the signal lines are different are arranged to be mixed.

In the present example embodiment, as illustrated in FIG. 16 and FIG. 17, a plurality of crossbar switches whose ratios (N(sw)/N(cp)) of the total number N(sw) of the switch cells to the total number N(cp) of the cross-points of the signal lines (RH, RV) are different can be used in one logic integrated circuit. For example, it is assumed that the ratio (N(sw)/N(cp)) of a crossbar switch for operating the look-up tables as one cluster by connecting the look-up tables in the logic element is 100%. In this case, the ratio (N(sw)/N(cp)) of a crossbar switch for switching wires including four lanes of signal lines having a length of eight segments (separated by a distance equivalent to eight logic elements) can be 50% or the like.

As just described, in the case of two or more crossbar switches whose ratios (N(sw)/N(cp)) are different, the shift direction of switch cells to be rearranged is aligned as illustrated in FIG. 16. In addition, the switch cells are arranged periodically corresponding to the cross-points between the signal lines (RH, RV). In addition, as illustrated in FIG. 17, even in crossbar switches whose densities of signal lines (RH) are different when viewed from the upper surface of the substrate, crossbar switches that can share the signal lines (RH) are selected to be arranged in the horizontal direction one another, and adjacent one another's signal lines (RH) are connected.

Accordingly, the signal lines (RH, RV) and the signal lines (GH, SV) for switching can be easily shared in the shift direction, and the decode circuit corresponding to the wires does not need to be changed. In addition, the switch cells are arranged periodically corresponding to the cross-points and in high regularity, the layout readability is high, and the calculation cost when mapping logic onto the reconfiguration circuit is low. In addition, the writing wires in the horizontal direction can be easily connected to one another without changing the arrangement pitch of the switch cells.

As described above, according to the present example embodiment, a crossbar switch that reduces the layout areas of the crossbar switch and peripheral circuits thereof can be provided.

The present invention is not limited to the above-described example embodiment, various modifications can be made within the scope of the invention described in Claims, and they are included in the scope of the present invention.

In addition, a part or all of the above-described example embodiment can also be described as the following supplementary notes, but are not limited thereto.

Supplementary Notes (Supplementary Note 1)

A crossbar switch including:

a plurality of first wires extending in a first direction;

a plurality of second wires extending in a second direction;

a plurality of third wires extending in a third direction;

a plurality of fourth wires extending in a fourth direction; and a plurality of switch cells connected to the first wires and the second wires, in which the first wires are skew relative to the second wires and the fourth wires, the third wires are skew relative to the second wires and the fourth wires, the switch cells are connected to the third wires and the fourth wires, and furthermore, the third wires are also connected to the switch cells connected to the first wires adjacent to the respective first wires, or furthermore, the fourth wires are also connected to the switch cells connected to the second wires adjacent to the respective second wires.

(Supplementary Note 2)

The crossbar switch according to Supplementary note 1, in which each of the switch cells includes a first switch, a second switch, and a transistor, each of the first switch and the second switch includes a resistive switching layer and two electrodes that sandwiches the resistive switching layer therebetween, one of the electrodes of the first switch and one of the electrodes of the second switch are connected, one of a source and a drain of the transistor is connected to the connection between the electrodes, the other of the electrodes of the first switch is connected to each of the first wires, the other of the electrodes of the second switch is connected to each of the second wires, a gate of the transistor is connected to each of the third wires, and the other of the source and the drain of the transistor is connected to each of the fourth wires.

(Supplementary Note 3)

The crossbar switch according to Supplementary note 1 or 2, in which the first direction and the third direction are parallel, and the second direction and the fourth direction are parallel.

(Supplementary Note 4)

The crossbar switch according to any one of Supplementary notes 1 to 3, in which the first direction and the second direction are perpendicular, and the third direction and the fourth direction are perpendicular.

(Supplementary Note 5)

The crossbar switch according to any one of Supplementary notes 1 to 4, in which the number of the switch cells is smaller than the number of cross-points between the first wires and the second wires.

(Supplementary Note 6)

The crossbar switch according to any one of Supplementary notes 1 to 5, in which the switch cells are provided periodically corresponding to the cross-points between the first wires and the second wires.

(Supplementary Note 7)

The crossbar switch according to any one of Supplementary notes 2 to 6, in which an arranging direction of the first switch and the second switch is parallel to the third direction or the fourth direction.

(Supplementary Note 8)

The crossbar switch according to any one of Supplementary notes 2 to 7, in which the first switch and the second switch are bipolar-type resistive switching elements, and are connected such that polarities of the resistive switching elements are opposed to each other.

(Supplementary Note 9)

The crossbar switch according to any one of Supplementary notes 2 to 8, in which the resistive switching layer is an atomic movement type using an ion-conducting layer.

(Supplementary Note 10)

A logic integrated circuit including the crossbar switch according to any one of Supplementary notes 1 to 9.

(Supplementary Note 11)

The logic integrated circuit according to Supplementary note 10 including a plurality of the crossbar switches whose ratios of the number of the switch cells to the number of the cross-points between the first wires and the second wires are different.

(Supplementary Note 12)

The logic integrated circuit according to Supplementary note 10 or 11, in which each of the switch cells is selected by turning ON/OFF the transistor by a voltage of each of the third wires, and a potential difference between each of the first wires and each of the second wires, and each of the fourth wires is changed to program a resistance state of the first switch and the second switch to be high resistance or low resistance.

(Supplementary Note 13)

A semiconductor device including the logic integrated circuit according to any one of Supplementary notes 10 to 12.

This application claims priority to Japanese Patent Application No. 2014-189843 filed on Sep. 18, 2014, the disclosure of which is incorporated herein in its entirety.

INDUSTRIAL APPLICABILITY

The present invention can be used for a programmable logic integrated circuit using a resistive switching element, and a semiconductor device.

REFERENCE SIGNS LIST 1 crossbar switch
2 logic integrated circuit
3 semiconductor device
11 first wire
12 second wire
13 third wire
14 fourth wire
15 switch cell

What is claimed is:

1. A crossbar switch including:

a plurality of first wires extending in a first direction;

a plurality of second wires extending in a second direction;

a plurality of third wires extending in a third direction parallel to the first direction;

a plurality of fourth wires extending in a fourth direction; and a plurality of switch cells connected to the first wires and the second wires, in which the first wires are skew relative to the second wires and the fourth wires, the third wires are skew relative to the second wires and the fourth wires, the switch cells are connected to the third wires and the fourth wires and are entirely between the third wires, and wherein at least two adjacent switch cells directly connected to the same third wire are directly connected to the different first wires.

2. The crossbar switch according to claim 1, in which each of the switch cells includes a first switch, a second switch, and a transistor, each of the first switch and the second switch includes a resistive switching layer and two electrodes that sandwiches the resistive switching layer therebetween, one of the electrodes of the first switch and one of the electrodes of the second switch are connected, one of a source and a drain of the transistor is connected to the connection between the electrodes, the other of the electrodes of the first switch is connected to each of the first wires, the other of the electrodes of the second switch is connected to each of the second wires, a gate of the transistor is connected to each of the third wires, and the other of the source and the drain of the transistor is connected to each of the fourth wires.

3. The crossbar switch according to claim 1, in which the first direction and the third direction are parallel, and the second direction and the fourth direction are parallel.

4. The crossbar switch according to claim 1, in which the first direction and the second direction are perpendicular, and the third direction and the fourth direction are perpendicular.

5. The crossbar switch according to claim 1, in which the number of the switch cells is smaller than the number of cross-points between the first wires and the second wires.

6. The crossbar switch according to claim 2, in which an arranging direction of the first switch and the second switch is parallel to the third direction or the fourth direction.

7. The crossbar switch according to claim 2, in which the first switch and the second switch are bipolar-type resistive switching elements, and are connected such that polarities of the resistive switching elements are opposed to each other.

8. A logic integrated circuit including the crossbar switch according to claim 1.

9. The logic integrated circuit according to claim 8 including a plurality of the crossbar switches whose ratios of the number of the switch cells to the number of the cross-points between the first wires and the second wires are different.

10. A semiconductor device including the logic integrated circuit according to claim 8.

* * * * *